US010310772B2

(12) United States Patent
Zhou

(10) Patent No.: US 10,310,772 B2
(45) Date of Patent: Jun. 4, 2019

(54) MEMORY CONTROL METHOD AND MEMORY CONTROL APPARATUS

(71) Applicants: Semiconductor Manufacturing International (Shanghai) Corporation, Shanghai (CN); Semiconductor Manufacturing International (Beijing) Corporation, Beijing (CN)

(72) Inventor: Shi Cong Zhou, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 56 days.

(21) Appl. No.: 15/361,295

(22) Filed: Nov. 25, 2016

(65) Prior Publication Data
US 2017/0147266 A1 May 25, 2017

(30) Foreign Application Priority Data

Nov. 24, 2015 (CN) .......................... 2015 1 0824800

(51) Int. Cl.
G06F 3/06 (2006.01)
G06F 12/02 (2006.01)
G11C 16/10 (2006.01)
G11C 16/16 (2006.01)
G11C 16/34 (2006.01)

(52) U.S. Cl.
CPC .......... *G06F 3/0679* (2013.01); *G06F 3/0616* (2013.01); *G06F 3/0619* (2013.01); *G06F 3/0652* (2013.01); *G06F 3/0661* (2013.01); *G06F 12/0246* (2013.01); *G11C 16/10* (2013.01); *G11C 16/16* (2013.01); *G11C 16/3418* (2013.01); *G11C 16/3431* (2013.01)

(58) Field of Classification Search
None
See application file for complete search history.

(56) References Cited

U.S. PATENT DOCUMENTS 5,365,486 A 11/1994 Schreck
5,369,616 A 11/1994 Wells et al.
(Continued)

*Primary Examiner* — Charles Rones
*Assistant Examiner* — Hewy H Li
(74) *Attorney, Agent, or Firm* — Anova Law Group, PLLC

(57) ABSTRACT

The present disclosure provides memory control methods and memory control apparatus. An exemplary method includes providing a memory having a targeted memory zone, the targeted memory zone having a plurality of memory cells, and a storage capacity of each memory cell being one page; receiving and reading out to-be-stored data and obtaining the targeted address information of the to-be-stored data; reading out data status of all memory cells of a targeted memory zone; determining the data status of the memory cells of the targeted memory zone; performing a programming operation to a memory cell with an erased state to write the to-be-stored data into the memory cell with the erased state; and performing an erasing operation to a memory cell having a logic address of written data to remove the logic address.

18 Claims, 5 Drawing Sheets

(56) References Cited

U.S. PATENT DOCUMENTS

| | | | |
|---|---|---|---|
| 8,131,915 B1 | 3/2012 | Yang | |
| 2006/0259718 A1* | 11/2006 | Paley | G06F 11/1072 |
| | | | 711/159 |
| 2007/0021963 A1* | 1/2007 | Deng | G06F 11/1441 |
| | | | 711/103 |
| 2007/0083697 A1* | 4/2007 | Birrell | G06F 12/0246 |
| | | | 711/103 |
| 2008/0229003 A1* | 9/2008 | Mizushima | G06F 12/0804 |
| | | | 711/103 |
| 2009/0109788 A1 | 4/2009 | Moon et al. | |
| 2009/0172466 A1* | 7/2009 | Royer | G06F 11/1064 |
| | | | 714/6.12 |

* cited by examiner

MEMORY CONTROL METHOD AND MEMORY CONTROL APPARATUS

CROSS-REFERENCES TO RELATED APPLICATIONS

This application claims the priority of Chinese patent application No. 201510824800.X, filed on Nov. 24, 2015, the entirety of which is incorporated herein by reference.

FIELD OF THE INVENTION

The present invention generally relates to the field of memory technology and, more particularly, relates to memory control methods and memory control apparatus.

BACKGROUND

Electrically erasable programmable read-only memories (EEPROMs) are a type of memory chips that do not lose data when they are powered-off. In practical applications, when a data is written in an EEPROM, if the length of the data is greater than one page, the data is refreshed by a length of one page or a length less than one page for each writing operation cycle. That is, if the data length is greater than one page, it needs multiple times of writing operations to save the entire data.

In each of the multiple times of writing operations, the targeted storage region is erased firstly. Then, the erased targeted storage region is programmed, and the writing operation of the page of data is completed.

Specifically, as shown in FIG. 1, when the erasing operation is performed on the targeted storage region, the data status of the targeted storage region changes from a valid state (a complete state) to an indefinite state (an incomplete state). Then, the data status of the targeted storage region changes from the indefinite state to the valid state; and the erasing operation is completed. When the programming operation (i.e., the writing operation) is performed on the targeted storage region, the data status of the targeted storage region changes from the erased state to an indefinite state. Then, the data status of the targeted storage region changes from the indefinite state to a valid state; and the programming operation is completed. When the data writing operation is completed in the targeted storage region, a new physical address is used as a new targeted storage region; and the data writing operation is repeated to update the data in the new targeted storage region.

However, during the data writing operation, when the current targeted storage region is at the indefinite state or the erased state, the data would be lost if the power is off. To prevent the data loss, a data backup method is often used. That is, the to-be-stored data is sequentially written into a targeted storage region and a backup storage region, and no matter what would happen, one of the targeted storage region and the backup storage would be at a valid state. That is, for a to-be-stored data, an erasing operation and a programming operation are performed in a targeted storage region; and then an erasing operation and a programming operation are performed in a backup storage region; and the data status of at least one of the targeted storage region and the backup storage region is ensured to be at the valid state.

For such data storage operations, when the data length is N pages, it needs 2N times of erasing operations and 2N times of programming operations to complete the storage of the entire data. Thus, the number of erasing times is too many times; and the erasing time is too long. Accordingly, the life span of the EEPROM may be reduced.

Further, because each page has a targeted storage region and a backup storage region. Thus, when the data length is N pages, it needs to take up 2N pages of storage spaces. Accordingly, the area of the EEPROM is increased; and the cost is increased as well.

The disclosed memory control method and memory control apparatus are directed to solve one or more problems set forth above and other problems in the art.

BRIEF SUMMARY OF THE DISCLOSURE

One aspect of the present disclosure includes a memory control method. The memory control method includes providing a memory having a targeted memory zone, the targeted memory zone having a plurality of memory cells, and a storage capacity of each memory cell being one page; receiving and reading out to-be-stored data and obtaining the targeted address information of the to-be-stored data; reading out data status of all memory cells of a targeted memory zone; determining the data status of the memory cells of the targeted memory zone; performing a programming operation to a memory cell with an erased state to write the to-be-stored data into the memory cell with the erased state; and performing an erasing operation to a memory cell having a logic address of written data to remove the logic address.

Another aspect of the present disclosure includes a control apparatus of a memory including a plurality of memory cells, the plurality of the memory cells including a first memory cell with an initial status being at an erased state, and a storage capacity of each memory cell being one page. The control apparatus includes a first acquisition unit, configured to receive a to-be-stored data and obtain a targeted address of the to-be-stored data, a read out unit, configured to read out data status of all memory cells of the target memory zone; a programming unit, configured to perform a programming operation to a memory cell with an erased status and write the to-be-stored data to the memory cell with the erased status; and an erasing unit, configured to perform an erasing operation to prepare for a next data writing operation after writing the to-be-stored data into the memory cell with the erased status.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
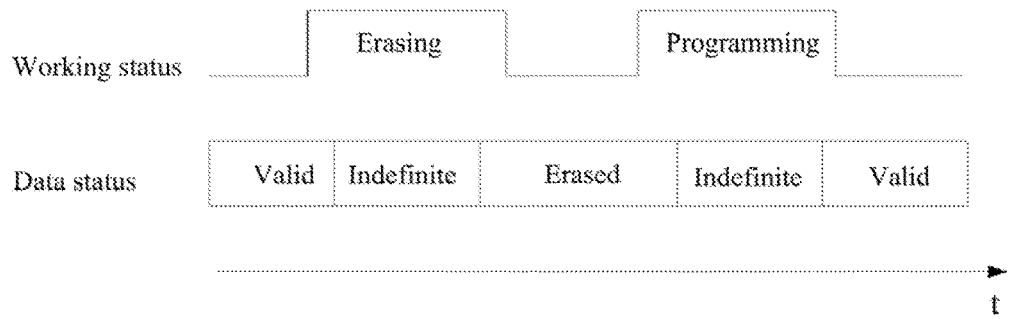
FIG. 1 illustrates an existing data write operation of a memory.
Figure 2:
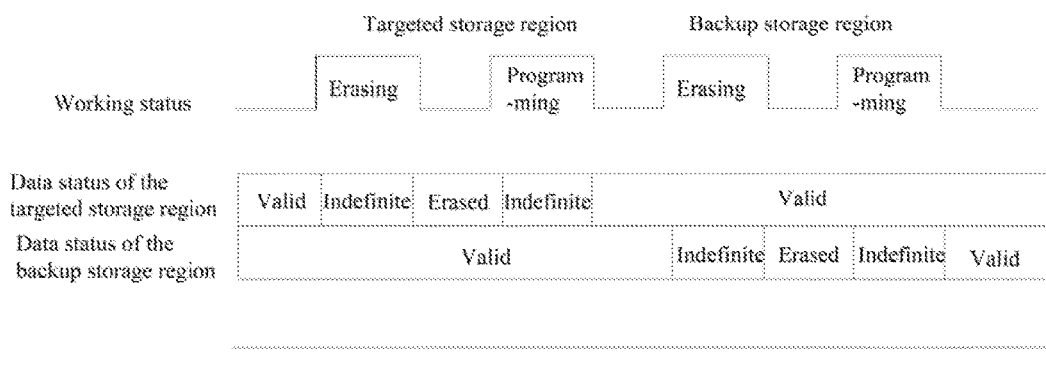
FIG. 2 illustrates another existing data write operation of a memory.

Currently, when data is written into a memory, to avoid the data loss caused by power-off during the data writing operation, a backup storage method is often used. FIG. 2 illustrates an existing data writing operation of a memory.

As shown in FIG. 2, when the to-be-stored data is a one-page data, in the initial stage, the data in the targeted storage region and the data in the backup storage region are identical. When the data is written in the memory, the targeted storage region may be erased firstly so as to change the data status of the targeted storage region from a valid state to an indefinite state; and then from the indefinite state to an erased state. After erasing the targeted storage region, the to-be-stored data is written into the targeted storage region. From performing the erasing operation to the targeted storage region to writing the to-be-stored data into the targeted storage region, the data status of the backup storage region is always at a valid state. Thus, during the operations to write the to-be stored data into the targeted storage region, no matter when the operation is interrupted, the original data in the targeted storage region will not be lost.

After writing the to-be-stored data into the targeted storage region, an erasing operation is performed to the data in the backup storage region firstly; and the new data (to-be-stored data) is written in. The data status of the targeted storage region is always at the valid state. Thus, during the operations to write the to-be stored data into the targeted storage region, no matter when the operation is interrupted, the data written into the targeted storage region will not be lost.

Figure 3:
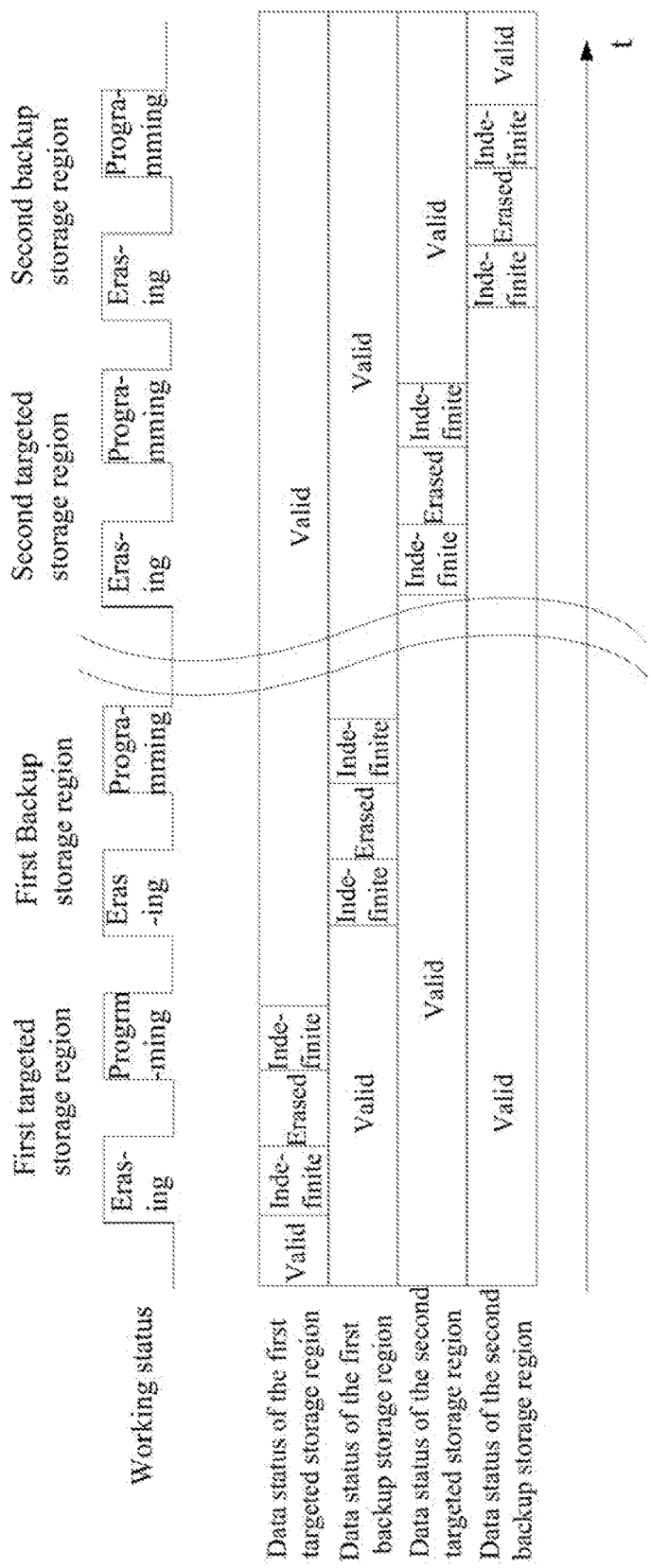
FIG. 3 illustrates another existing data write operation of a memory.

Further, as shown in FIG. 3, when the to-be-stored data is a two-page data, the targeted storage region includes a first targeted storage region and a second targeted storage region. The backup storage region includes a first backup storage region and a second backup storage region.

Specifically, an erasing operation is performed on the first targeted storage region firstly; and a programming operation is performed on the first targeted storage region to write one page of the two-page data. Then, an erasing operation is performed to the first backup storage region firstly; and a programming operation is performed to the first backup storage region After writing the one page of data into the first targeted storage region and the first backup storage region, the other page of data is sequentially written into the second targeted storage region and the second backup storage region by following the operations for writing the one page of data into the first targeted storage region and the first backup storage region. At any time, the data status of the first targeted storage region or the first backup storage region is always at a valid state; or the data status of the second targeted storage region or the second backup storage region is always at a valid state. Thus, no matter when the operations are interrupted, the memory is always able to keep at least one valid data; and the data is safely written.

However, when the operations illustrated in FIG. 2 and FIG. 3 are used to write a data into a memory, although the safe data writing operation is able to achieve, writing each page of data needs to perform two times of programming operations and two times of erasing operations. When the length of the to-be-stored data is N pages, it needs 2N times of programming operations and the 2N times of erasing operations. Thus, the erasing times of the memory may be too many times; and the life span of the memory may be adversely affected. Further, when the data length is N pages, the targeted storage region and the backup storage region occupy 2N pages of storage spaces. Thus, the area of the memory is increased.

To solve above problems and other related problems, the present disclosure provides a memory control method. By using the disclosed memory control method, when the to-be-stored data is received, the targeted address information may be obtained. According to the targeted address information, the data status of the memory cells in the targeted memory zone may be determined to be at a valid state, an erased state, or an indefinite state. The to-be-stored data may be written (programmed) into the first memory cell according to the different combinations of the data status of the memory cells in the targeted memory zone. Then, an erasing operation may be performed to the memory cell having a corresponding logic address to remove the logic address to achieve a safe write of the to-be-stored data.

During the process for writing the data to the first memory cell, because the data status of the memory cell corresponding to the targeted address may also be at the valid state, no matter when the data writing operation is interrupted, the memory may be able to at least keep one valid data; and the safe data writing may be achieved.

Further, when a data is written into the memory, under the condition ensuring the data to be safe, each page of the data may only need one time of programming operation and one time of writing operation. Thus, the erasing time of the memory is significantly reduced; and the life span of the memory may be increased.

Further, when the data length is N pages, it may only need (N+1) pages of storage spaces. Thus, the area of the memory is reduced.

Figure 4:
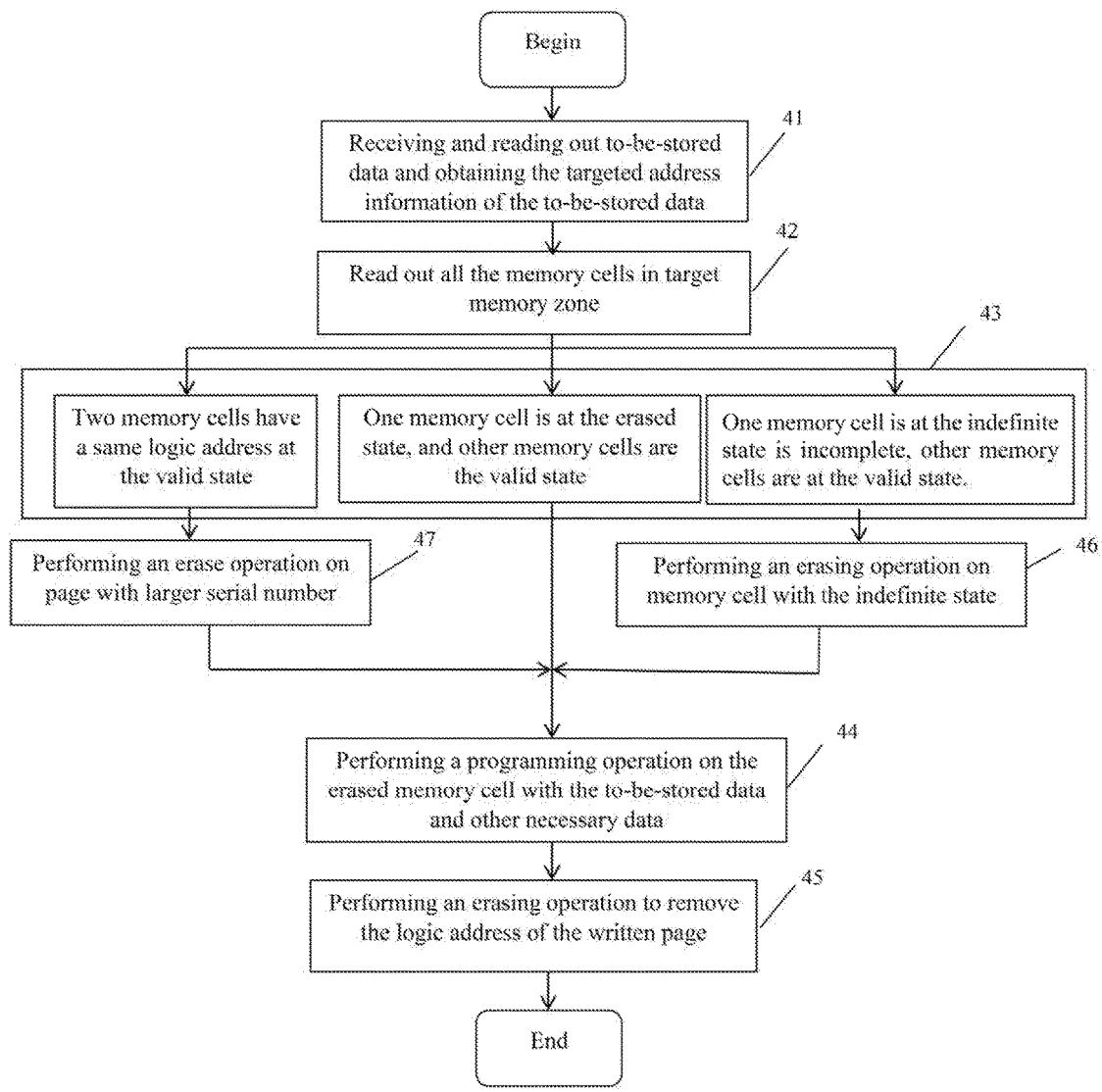
FIG. 4 illustrates an exemplary memory control method consistent with the disclosed embodiments.

The present disclosure provides a memory control method and apparatus. FIG. 4 illustrates an exemplary memory control method consistent with the disclosed embodiments.

In one embodiment, the memory may include a plurality of memory cells. The plurality of memory cells may include at least one memory cell having an initial status at an erased state. The memory cell having the initial status at the erased state may be referred to as a first memory cell That is, the plurality of memory cells may include at least one first memory cell. Each memory cell may be able to store one page of data. When the length of a to-be-stored data is N pages, the storage space of the memory may be at least (N+1) pages; and at least one of the (N+1) pages may be for the first memory cell.

As used herein, the initial status of the memory cell may be referred to the data status in the memory cell before writing the to-be-stored data into the memory each time. When the to-be-store data needs to be written by multiple times to complete the storage, there is at least one first memory cell needed, before each writing operation.

In certain embodiments, the memory may include a plurality of first memory cells. The number of the first memory cell may not be limited as long as there is at least one memory cell for each write operation.

As shown in FIG. 4, the control method may include receiving and reading out a to-be-stored data, and obtaining the targeted address information of the to-be-stored data (Step S41). Specifically, when the to-be-stored data is written into the memory, the length of the data written each time is limited by the length of the memory, and may not be longer than one page. When the length of the data is shorter than or equal to one page, the data storage (writing) may be completed by one writing operation. When the length of the data is multiple pages, it may need multiple writing operations to complete the storage (writing) of the entire data.

That is, the to-be-stored data may include a plurality of segments of to-be-stored data; and each segment of data may be smaller than or equal to one page.

In the practical application, each segment of the to-be-stored data may not only include the information of the data itself, but also include the targeted address information corresponding to the segment of to-be-stored data and the identification information of the segment of to-be-stored data. The targeted address information may correspond to a physical address of the segment of the to-be-stored data in the memory; and may often be a targeted logic address information. The identification information may utilize serial numbers. According to the identification information and the targeted address information, the uniqueness of the segment of the to-be-stored data may be confirmed.

In one embodiment, the memory may be an apparatus having a data storage function. The apparatus may be used to read and write data. For example, the memory may be an electrically erasable programmable read-only memory (EEPROM). The memory may be an independent apparatus, or may provide other services simultaneously. For example, one may be disposed as an exclusive data storage region (zone) in other apparatus to provide a data storage service. Such memories may all be used to read and write data.

Further, as shown in FIG. 4, the control method may also include reading out all memory cells of the targeted memory zone (Step S42). By reading out all memory cells in the targeted memory zone, the data status of the targeted memory zone may be obtained. The targeted memory zone may include a plurality of memory cells; and each memory cell may be used to store one page of data. That is, each page of data may be corresponding to one memory cell. The data in each memory cell may include a data segment, a logic address, a serous number, and a verification code.

Usually, the data status of each memory cell may include an erased state, an indefinite state and a valid state. The erased state may refer to that the data in the memory cell is already erased; and new data may be written into the memory cell. The indefinite state may refer to that the data in the memory cell may be incomplete, which may be caused by an interruption during the programming operation. When the programming operation is interrupted, a new data may not be directly written into the memory cell. The valid state may refer to that the data in the memory cell may be complete; and the data in the memory cell may be directly read out. If the data has a plurality of pages, the targeted memory zone may have a plurality of memory cells; and each memory cell may be at one of the three states.

In certain other embodiments, the step S42 may be performed firstly, followed by performing step S41. In still certain other embodiments, the step S41 and the step S42 may be performed simultaneously.

Further, as shown in FIG. 4, the control method may also include determining the data status of the memory cells (S43). Specifically, before obtaining the to-be-stored data, the data in the memory cell of the memory corresponding to the targeted address may be read out. If the data in the memory cell of memory corresponding to the targeted address is able to be read out, the data status of the memory cell may be either at the valid state or at the indefinite state. If the data in the memory cell of the memory corresponding to the targeted address is unable to be read out, the data status in the memory cell may be at the erased state; and the memory cell corresponding to the targeted address may be the first memory cell.

In one embodiment, when the data in the memory cell of the memory corresponding to the targeted address is read out, the status of the read out data may be determined by verifying the read out data.

The read out data may be verified by any appropriate methods. In one embodiment, determining information may be included in the written data. Thus, the written data may not only include the data itself, but also include the determining information. Thus, during the read out operation of the data in the memory cell, the read out data may be determined to be complete or incomplete according to the determining information. Accordingly, the data status of the memory cell may be determined using the determining results. When the completeness of the read out data is identified by the determining information, a parity check may be used.

Further, as shown in FIG. 4, the read out result of the targeted memory zone may having three possibilities. First, one memory cell is at the erased state, and other memory cell are at the valid state. Second, two or more memory cells are at the valid state, and have a same logic address. Third, one memory cell is at the indefinite state, i.e., the data in the memory is incomplete.

Referring to FIG. 4, when one memory cell is at the erased state, i.e., a first memory cell, and other memory cells are at the valid state, a programming operation may be performed on the first memory cell to write the page of the to-be stored data having a targeted address corresponding to the first memory cell and other necessary data in the first memory cell (step 44). That is, the step S44 may include performing a programming operation to the first memory cell; and the page of to-be-stored data having the targeted address corresponding to the first memory cell and other necessary data may be written into the first memory cell After writing the page of the to-be-stored data having the targeted address corresponding to the first memory cell into the first memory cell, an erasing operation may be performed to the memory cell corresponding to the original targeted logic address (Step S45). The memory cell corresponding to the original targeted logic address may be turned into the first memory cell; may be prepared for a next data write operation.

Further, referring to FIG. 4, when the data status of one memory cell is at the indefinite state. i.e., the data in such a memory cell is incomplete, and other memory cells are at the valid state, an erasing operation may be performed on the memory cell having the incomplete data; and the erased memory cell may become the first memory cell (S46). Then, a programming operation may be performed on the first memory cell to write the page of the to-be stored data having a targeted address corresponding to the first memory cell and other necessary data in the first memory cell (step 44). That is, the step S44 may include performing a programming operation to the first memory cell; and the page of to-be-stored data having the targeted address corresponding to the first memory cell and other necessary data may be written into the first memory cell.

After writing the page of the to-be-stored data having the targeted address corresponding to the first memory cell into the first memory cell, an erasing operation may be performed to the memory cell corresponding to the original targeted logic address (Step S45). The memory cell corresponding to the original targeted logic address may be turned into the first memory cell; may be prepared for a next data write operation.

Further, referring to FIG. 4, when the data status of two memory cells are both at the valid state; and the two memory cells have a same logic address, an erasing operation may be performed on the memory cell having a larger serial number; and the erased memory cell may become the first memory cell (S47). Then, a programming operation may be performed on the first memory cell to write the page of the to-be stored data having a targeted address corresponding to the first memory cell and other necessary data in the first memory cell (step 44). That is, the step S44 may include performing a programming operation to the first memory cell, and the page of to-be-stored data having the targeted address corresponding to the first memory cell and other necessary data may be written into the first memory cell.

After writing the page of the to-be-stored data having the targeted address corresponding to the first memory cell into the first memory cell, an erasing operation may be performed to the memory cell corresponding to the original targeted logic address (Step S45). The memory cell corresponding to the original targeted logic address may be turned into the first memory cell; may be prepared for a next data write operation.

A detailed description for writing a to-be-stored data X into a memory and erasing a memory cell according to the step S44 and the step 45 may be as follows. The length of the to-be-stored data may be two pages.

Figure 5:
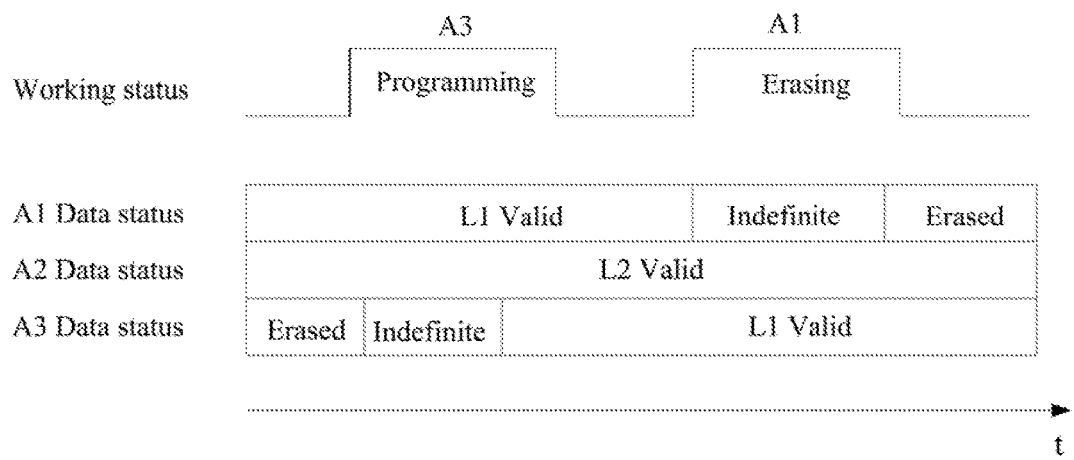
FIG. 5 illustrates an exemplary data write operation of a memory consistent with the disclosed embodiments.
Figure 6:
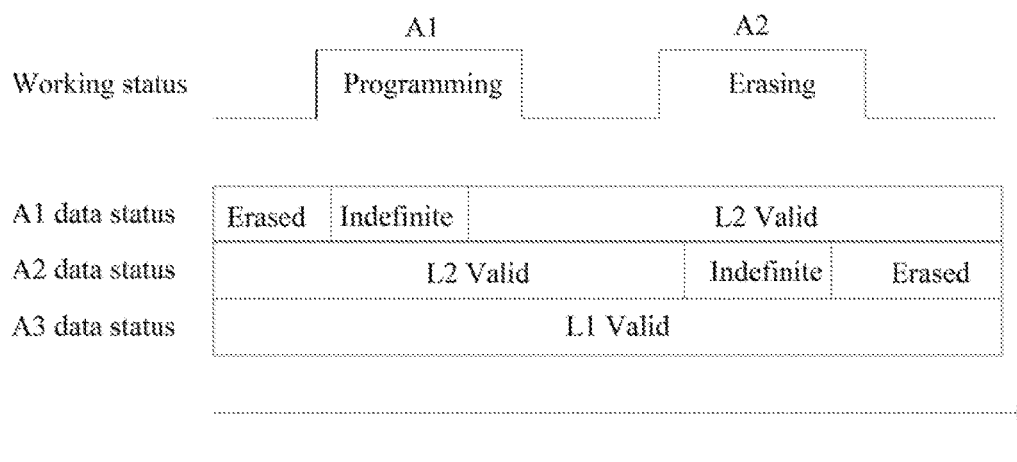
FIG. 6 illustrates another exemplary data write operation of a memory consistent with the disclosed embodiments.

As shown in FIG. 5 and FIG. 6, the memory may include a memory cell with a physical address A1, a memory cell with a physical address A2 and a memory cell with a physical address A3. Before performing a data writing operation, the data status of the memory cell with the physical address A1 and the data status of the memory cell with the physical address A2 may all be at the valid state, and the stored data may be with a logic address L1 and a logic address L2, respectively. The data status of the memory cell with a physical address A3 may be at the erased state. Under such a condition, the memory cell with the physical address A3 may be the first memory cell.

The to-be-store data X may include a data X1 and a data X2, the data length of the data X1 and the data X2 may be one page, respectively. The data writing process may include, sequentially, writing the data X1 in the memory; and writing the data X2 in the memory. The targeted address of the data X1 may be the physical address A1; and the targeted address of the data X2 may be the physical address A2

Specifically, when writing the data X1 in the memory, because the data in the memory cell with the physical address A1 and the data in the memory cell with the physical address A2 are at the valid state, the data of the in the memory cell with the physical address A3 is at the erased state, a writing operation may be performed to the memory cell with the physical address A3. The data X1 and the logic address L1 may be written into the memory cell with the physical address A3 (the first memory cell). Then, an erasing operation may be performed to the memory cell with the physical address A1 to remove the logic address L1 in the memory cell A1. The memory cell with the physical address A1 may be turned into a first memory, i.e., the data status is at the erased state.

After performing the erasing operation to the memory cell with the physical address A1 to remove the logical address L1, and before writing the data X2 in the memory, because the memory cell with the physical address A1 may be the first memory cell, the programming operation may be performed to the memory cell A1, and the data X2 and the logic address L2 may be written in the memory cell A1. Then, an erasing operation may be performed to the memory cell with the physical address A2 to remove the logic address L2 in the physical address L2. The memory cell with the physical address A2 may be turned into the first memory cell.

As shown in FIG. 5 and FIG. 6, at any time, the data status of at least one data in the memory cell with the physical address A1, the memory cell with the physical address A2 and the memory cell with physical address A3 may be at the valid state. Thus, no matter when the writing operation is interrupted, at least one complete data may be stored in the memory. Further, when the data length of the to-be-stored data is N pages, the write operation may only need N times of programming operations and N times of erase operations. Thus, the erasing times of the memory may be half reduced.

Further, when the data length of the to-be-stored data is N pages, it may only need (N+1) pages of storage spaces to complete the write operation of the entire data; and it does not need 2N pages of storage spaces. Thus, the area of the memory may be significantly reduced.

In one embodiment, if the write operation is interrupted after the step S44 and before the step S45, there may be no memory cell with a data status of the erased state before writing the data into the memory, but there may be memory cells having a same logic address and being at the valid state. Under such a condition, the identification information of each data may be obtained firstly. The writing sequence of the data may be determined according to the identification information. Then, a valid memory cell may be determined according to the correlation between the write sequence and the validation of the storage region.

For example, when data are written into a memory, the serial number of the data may be sequentially increased. Thus, when the data having a same targeted address are all at the valid state, the data having a smaller serial number may be the data that is written earlier; and the data having a larger serial number may be the data that is written later. Correspondingly, the memory cell having the data with the smaller serial number may be a valid memory cell; and the memory cell having the larger serial number may be an indefinite memory cell.

An erasing operation may be performed on the indefinite memory cell. That is, the indefinite memory cell may be turned into the first memory cell, and the step 44 may be continued Under such a condition, all the valid memory cells may be the memory cells corresponding to the targeted address. Thus, when the step 45 is performed, it may only need to perform an erasing operation to the valid memory cell.

The step 46 may include performing an erasing operation to the memory cell having a data status of the indefinite state. The memory cell having the data status of the indefinite state may be turned into a memory cell with a data status of the erased state.

In one embodiment, after reading the data in the each memory cell of the memory, if there is no memory cell in the memory having the data status of the erased state, that is, there is no first memory cell, but there is a memory cell having the data status of the indefinite state, the memory cell having the data status of the indefinite state may be turned into a memory cell having the data status of the erased state. That is, the memory cell having the data status of the indefinite state may be turned into the first memory cell. Thus, the memory may have at least one first memory cell between two writing operations.

After the memory cell having the data status of the indefinite state is turned into the first memory cell, the step S44 may be continued.

The step 47 may include performing an erasing operation to the valid memory cell which has a same logic address and a larger serial number, and turned it to the erased state. That is, when the data status of the memory cell corresponding to the targeted address is determined to be at the erased state, the to-be-stored data may be directly written into the memory cell corresponding to the targeted address.

When a new data is written into the memory for a next time, the steps 41-47 may be repeated.

Thus, according to the disclosed embodiments, when the data status of the memory cell corresponding to the targeted address is determined to be at the valid state, the to-be-stored data may be written into the first memory cell firstly. Then, the erasing operation may be performed to the memory cell corresponding to the targeted address to achieve a safe write of the to-be-stored data. That is, comparing with the existing data writing methods, in which the data in the memory cell is erased firstly, followed by writing the to-be-stored data, the disclosed method may include programming the to-be-stored data firstly; and followed by erasing the memory cell having the corresponding logic address.

Further, when a data is written into the memory, under the condition ensuring the data to be safe, each page of the data may only need one time of programming operation and one time of erasing operation. Thus, the erasing times of the memory are significantly reduced; and the life span of the memory may be increased.

Further, when the data length is N pages, it may only need (N+1) pages of storage spaces. Thus, the area of the memory is reduced.

Figure 7:
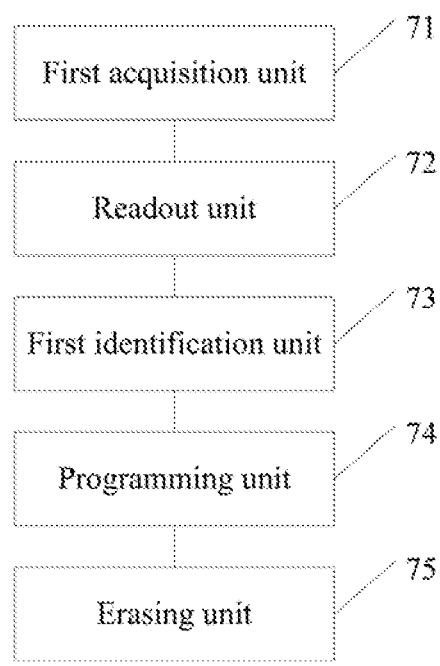
FIG. 7 illustrates an exemplary memory control apparatus consistent with the disclosed embodiments

FIG. 7 illustrates an exemplary memory control apparatus consistent with the disclosed embodiments. The memory may include a plurality of memory cells. The plurality of memory cells may include a first memory cell. The initial status of the first memory cell may be at an erased state. The storage capacity of each memory cell may be one page.

As shown in FIG. 7, the memory control apparatus may include a first acquisition unit 71, a readout unit 72, a first determining unit 73, a programming unit 74 and an erasing unit 75.

The first acquisition unit 71 may be configured to receive the targeted address of the to-be-stored data. The readout unit 72 may be configured to read out the data in each of plurality of memory cells of the targeted memory zone. The first determining unit 73 may be configured to determine the data status of all the memory cells. The programming unit 74 may be configured to perform a programming operation to the first memory cell, and write the to-stored data into the first memory cell according to the data status of the memory cells. The erasing unit 75 may be configured to perform an erasing operation to the memory cell corresponding to the targeted address to erase the corresponding logic address, and prepare for a data writing operation.

In one embodiment, the erasing unit 75 may also be configured to perform an erasing operation to a memory cell with a data status of the indefinite state when there is no memory cell with a data status of the erased state, but there is a memory cell with a data status of the indefinite state in the read memory. That is, one memory cell in the targeted memory zone may be at the indefinite state; and other memory cells may be at valid state. Thus, the erasing unit 75 may be able to turn the memory cell with the data status of the indefinite state into a memory cell with a data status of the erased state, i.e., the first memory cell.

In one embodiment, the to-be-stored data received by the first data acquisition unit 71 may include data information, targeted address information and an identification information of the data. In certain other embodiments, the to-be-stored data received by the first data acquisition unit 71 may also include determining information. The first determining unit 73 may be configured to obtain the determining information of the data in the memory cell corresponding to the targeted address according to the targeted address; and to determine if the data status of the memory cell corresponding to the targeted address is at the valid state Further, the memory control apparatus may also include a second acquisition unit and a second determining unit (not shown). The second acquisition unit may be configured to obtain the identification information in each segment of the data when two memory cells are at the valid state and have a same logic address. The second determining unit may be configured to determine the serial numbers of the two memory cells. Under such a condition, the erasing unit may be configured to perform an erasing operation to the memory cell having a larger serial number; and turn the memory cell having the larger serial number to the first memory cell.

The above described method and steps may be achieved by using a program to operate corresponding hardware. The program may be stored in a computer-readable storage media. The storage media may include programmable ROM, hard disk, or optical disk, etc.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A memory control method, comprising:
   providing a memory having a targeted memory zone, the targeted memory zone having a plurality of memory cells, and a storage capacity of each memory cell being one page;
   receiving and reading out to-be-stored data and obtaining the targeted address information of the to-be-stored data;
   reading out data status of each of the plurality of memory cells of the targeted memory zone, the data status of the each of the plurality of memory cells of the targeted memory zone being one of an erased state, an indefinite state, and an active state;
   determining the data status of the each of the plurality of memory cells of the targeted memory zone;
   performing a programming operation to a memory cell with the erased state to write the to-be-stored data into the memory cell with the erased state; and
   performing an erasing operation to a memory cell having a logic address of written data, wherein:
   two memory cells of the plurality of memory cells of the targeted memory zone are at the valid state and have a same logic address, and
   an erasing operation is performed to a memory cell with a larger serial number before performing the programming operation.

2. The memory control method according to claim 1, wherein:
   one memory cell of the targeted memory zone is at the erased state; and
   the programming operation is performed to the memory cell with the erased state.

3. The memory control method according to claim 1, wherein:

one memory cell of the targeted memory zone is at the indefinite state; and
an erasing operation is performed to the memory cell with the indefinite state before performing the programming operation.

4. The memory control method according to claim 1, wherein the to-be-stored-data comprises:
data information;
targeted address information; and
identification information of the data.

5. The memory control method according to claim 4, wherein the to-be-stored data further comprises:
determining information.

6. The memory control method according to claim 1, wherein:
the step of reading out data status of all the plurality of memory cells is performed before the step of receiving and reading out the to-be-stored data.

7. The memory control method according to claim 1, wherein:
the step of reading out the data status in each of the plurality of memory cells is performed after the step of receiving and reading out the to-be-stored data.

8. The memory control method according to claim 1, wherein:
the step of reading out the data status in each of the plurality of memory cells and the step of receiving and reading out the to-be-stored data are performed simultaneously.

9. A control apparatus of a memory including a targeted memory zone having a plurality of memory cells, a storage capacity of each memory cell being one page, the apparatus comprising:
a first acquisition unit, configured to receive a to-be-stored data and obtain a targeted address of the to-be-stored data;
a read out unit, configured to read out data status of each of the plurality of memory cells of the target memory zone, the data status of the each of the plurality of memory cells of the targeted memory zone being one of an erased state, an indefinite state, and an active state;
a programming unit, configured to perform a programming operation to a memory cell with the erased status and write the to-be-stored data to the memory cell with the erased status;
an erasing unit, configured to perform an erasing operation to prepare for a next data writing operation after writing the to-be-stored data into the memory cell with the erased status;
a second acquisition unit, configured to obtain the identification information of each segment of the to-be-stored data respectively when two memory cells are at the valid state and have a same logic address; and
a second determining unit, configured to determine serial numbers of the two memory cells.

10. The control apparatus according to claim 9, wherein:
the erasing unit is also configured to perform an erasing operation to a memory cell with a data status of the indefinite state to turn the memory cell with a data status of the indefinite state into a memory cell with a data state of the erased state when one memory cell of the targeted memory zone has a data status of the indefinite state and other memory cell of the targeted memory are at the valid state.

11. A control apparatus of a memory including a targeted memory zone having a plurality of memory cells, a storage capacity of each memory cell being one page, the apparatus comprising:
a first acquisition unit, configured to receive a to-be-stored data and obtain a targeted address of the to-be-stored data;
a read out unit, configured to read out data status of all memory cells of the target memory zone;
a programming unit, configured to perform a programming operation to a memory cell with an erased status and write the to-be-stored data to the memory cell with the erased status; and
an erasing unit, configured to perform an erasing operation to prepare for a next data writing operation after writing the to-be-stored data into the memory cell with the erased status, wherein:
the erasing unit is also configured to perform an erasing operation to a memory cell having a larger serial number when the memory cell and another memory cell are both at the valid state and have a same logic address.

12. The control apparatus according to claim 9, wherein the to-be-stored data comprises:
data information;
targeted address information; and
identification information of the data.

13. The control apparatus according to claim 9, wherein:
the erasing unit is also configured to erase a memory cell with a larger serial number.

14. The control apparatus according to claim 12, wherein the to-be-stored data further comprises:
determining information.

15. The control apparatus according to claim 12, wherein:
the first determining unit is configured to obtain the determining information of the data in the memory cell corresponding to the targeted address according to the targeted address and determine if a data status of the memory cell corresponding to the targeted address is at the valid state according to the determining information.

16. The control apparatus according to claim 9, wherein:
the memory is an electrically erasable programmable read-only memory (EEPROM).

17. The memory control method according to claim 1, wherein the indefinite state is that the data in the memory cell is incomplete caused by an interruption of the erase operation performed on the memory cell or by an interruption of the programming operation performed on the memory cell.

18. The control apparatus according to claim 11, wherein the to-be-stored data comprises:
data information;
targeted address information; and
identification information of the data.

* * * * *